United States Patent [19]
Yu

[11] Patent Number: 5,902,025
[45] Date of Patent: May 11, 1999

[54] MODULARIZED COMPUTER SERVO WORKING CABINET

[75] Inventor: Chien-Chun Yu, Taipei, Taiwan

[73] Assignee: Symphony Group International Co., Ltd., Taipei, Taiwan

[21] Appl. No.: 08/993,631

[22] Filed: Dec. 18, 1997

[30] Foreign Application Priority Data

Jun. 3, 1997 [TW] Taiwan .......................... 85211201 A01

[51] Int. Cl.⁶ ...................................................... E06B 1/00
[52] U.S. Cl. ....................... 312/109; 312/263; 312/265.5; 312/249.11; 312/350
[58] Field of Search ........................... 312/249.8, 249.11, 312/265.5, 265.6, 265, 265.4, 295, 322, 326, 109, 263, 257.1, 334.7, 334.8, 350

[56] References Cited

U.S. PATENT DOCUMENTS

| | | | |
|---|---|---|---|
| 3,393,951 | 7/1968 | Sulentic | 312/350 |
| 4,148,535 | 4/1979 | Fenwick | 312/265.5 X |
| 4,421,366 | 12/1983 | Niziol | 312/265.6 |
| 4,462,647 | 7/1984 | Key | 312/265.5 |
| 4,793,667 | 12/1988 | Gilliom | 312/263 |
| 5,281,020 | 1/1994 | Romick | 312/249.11 X |

Primary Examiner—Peter M. Cuomo
Assistant Examiner—Stephen Vu
Attorney, Agent, or Firm—Bacon & Thomas, PLLC

[57] ABSTRACT

A modularized computer servo working cabinet having side wall plates which are assembled by a plurality of unit pieces. A sliding track is installed in a proper position of each side wall plate on an inner portion thereof for receiving one or more main frame racks. The racks have a U-shape and feed track grooves installed thereon. Each unit piece is a large plate with notches and stopping portions installed thereon for assembling with assembling pieces and connecting pieces. Each assembling piece is a medium plate with a flange installed thereon for engaging with the stopping portion and with a plurality of assembling piece holes installed thereon for fixing the sliding track and locking with the connecting pieces. Each connecting piece is a small plate with at least one insertion portion having holes for engaging with the assembling pieces. In assembling, the unit pieces are connected to one another and are fixedly locked by screws or the like so that the height and capacity of the cabinet may be increased as desired. Therefore, the present invention has relative flexibility and enhances the usability of space.

5 Claims, 5 Drawing Sheets

5,902,025

MODULARIZED COMPUTER SERVO WORKING CABINET

BACKGROUND OF THE INVENTION

Field of the Invention

The present invention relates to a new modularized computer servo working cabinet which is easy to attach with/ detach from other such cabinets and is easy to assemble. More specifically, it relates to a cabinet having side wall plates which are assembled by a plurality of unit pieces so as to increase the number of layers, thus improving the expansion and assembly abilities of the cabinet(s).

The prior drawer type computer servo working cabinet is mainly comprised of an outer covering cabinet having a bottom installed with at least a rolling element and a sliding track installed on a proper position on a periphery of the inner wall of the cabinet. A mobile frame is used for installing a main frame and a plurality of disk machines within the cabinet. A bead track groove coupling with the sliding track is installed on a respective position on the frame. The bottom of the cabinet includes a fan and a dust filter for heat dispersion. Thus, the control portion of a main frame may be pulled out from the cabinet making it convenient for installation, detachment, repair and expansion of parts on the computer circuit board.

However, since the volume of this computer servo working cabinet is unchangeable, if the main frame is expanded, another computer servo working cabinet must be purchased, thus increasing the cost and space requirement.

Therefore, in the new structure of the present invention, the cabinet is modularized so that the storing space may be enlarged as required. It is more economical and the volume may be increased many times over using an equal area. Since the structure is simple and practical, each modularized cabinet may be easily detached and transported.

SUMMARY OF THE INVENTION

The main object of the present invention is to provide a new modularized computer servo working cabinet which is easy to attach with/detach from other such cabinets and is easy to assemble. Modularizing allows one to increase the number of layers such that the expansion and assembly abilities are improved, and the product may be used conveniently.

In order to achieve this object, each side wall plate is assembled by a plurality of unit pieces. A sliding track is installed in a proper position of each side wall plate on an inner portion thereof for receiving one or more main frame racks. The main frame racks have a U-shape and have bead track grooves installed thereon. Each unit piece is a large plate with notches and stopping portions installed thereon for assembling with assembling pieces and connecting pieces. Each assembling piece is a medium plate with a flange installed thereon for engaging the stopping portion and with a plurality of assembling piece holes installed thereon for fixing the sliding track and locking with the connecting pieces. Each connecting piece is a small plate with at least one insertion portion having holes for engaging with the assembling pieces. In assembling, the unit pieces are connected to one another and are fixedly locked by screws or the like so that the height and capacity of the cabinet may be increased as desired. Therefore, the present invention has relative flexibility and enhances the usability of space.

The present invention will be better understood and its numerous objects and advantages will become apparent to those skilled in the art upon review of the following detailed description of a preferred embodiment, with reference to the following drawings in which:

DETAILED DESCRIPTION OF THE PREFERRED EMBODIMENT

Figure 1:
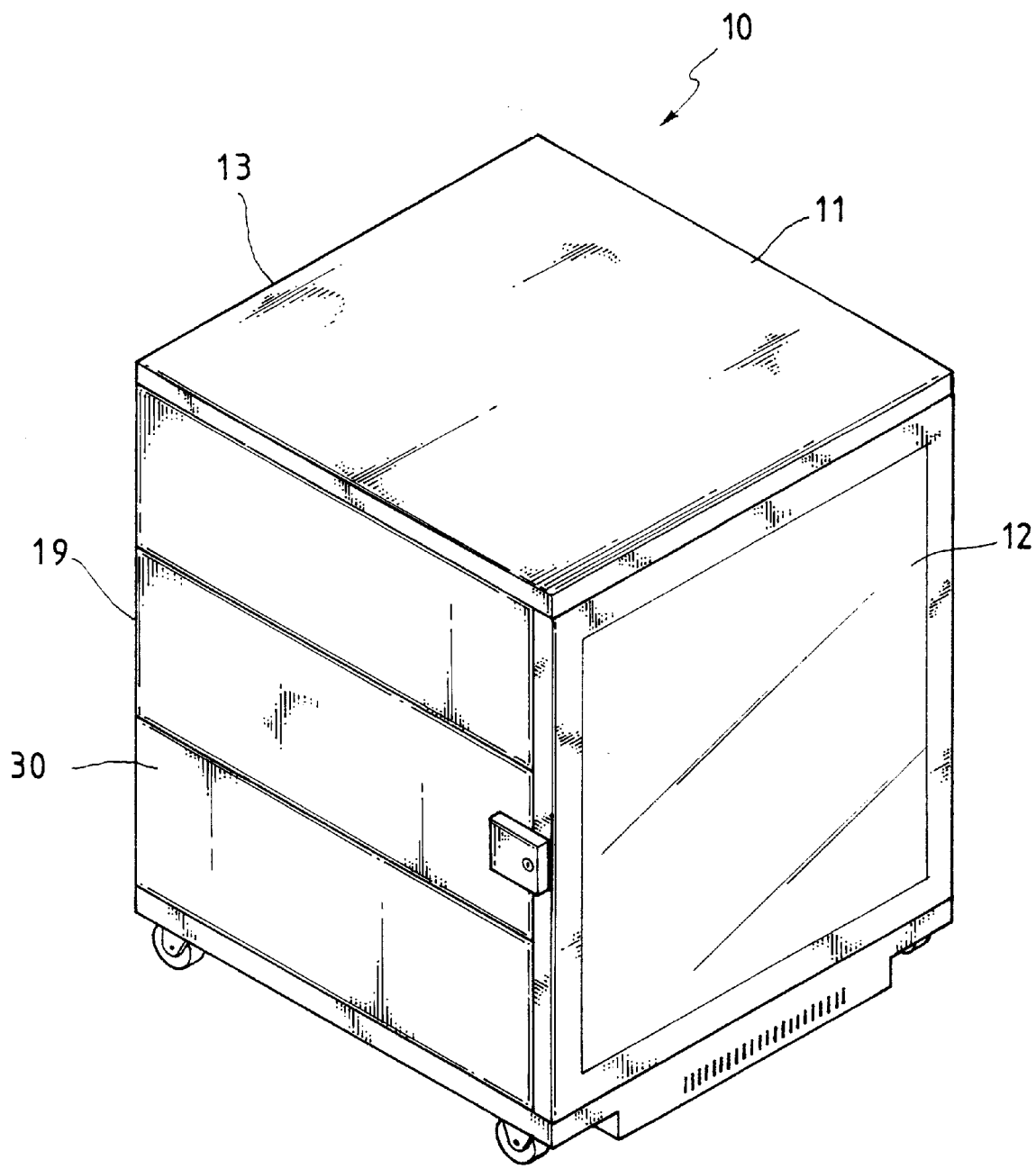
FIG. 1 is a perspective view of a preferred embodiment of the present invention.
Figure 2:
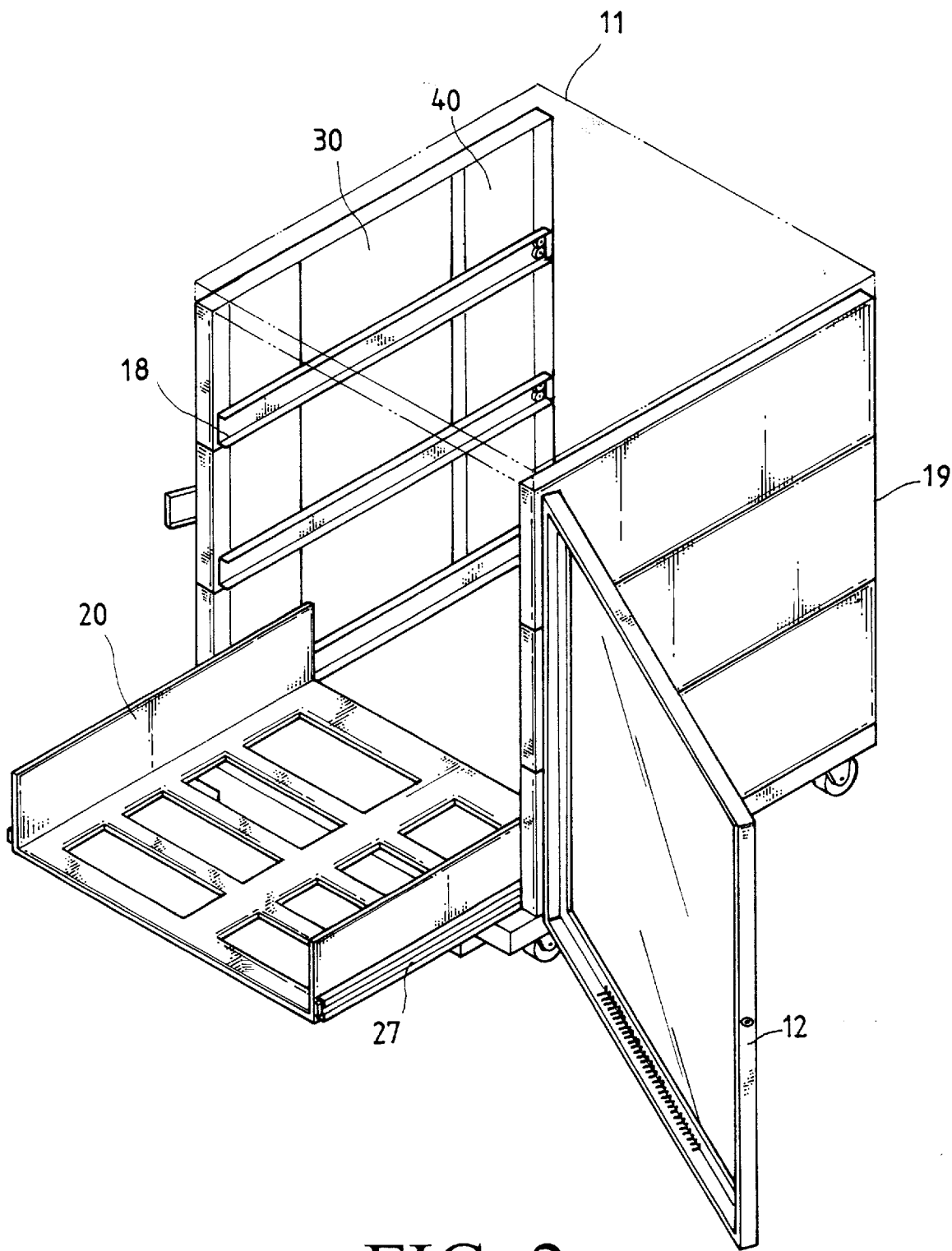
FIG. 2 is a perspective view of the inside of the cabinet with a pulled main frame rack.
Figure 3:
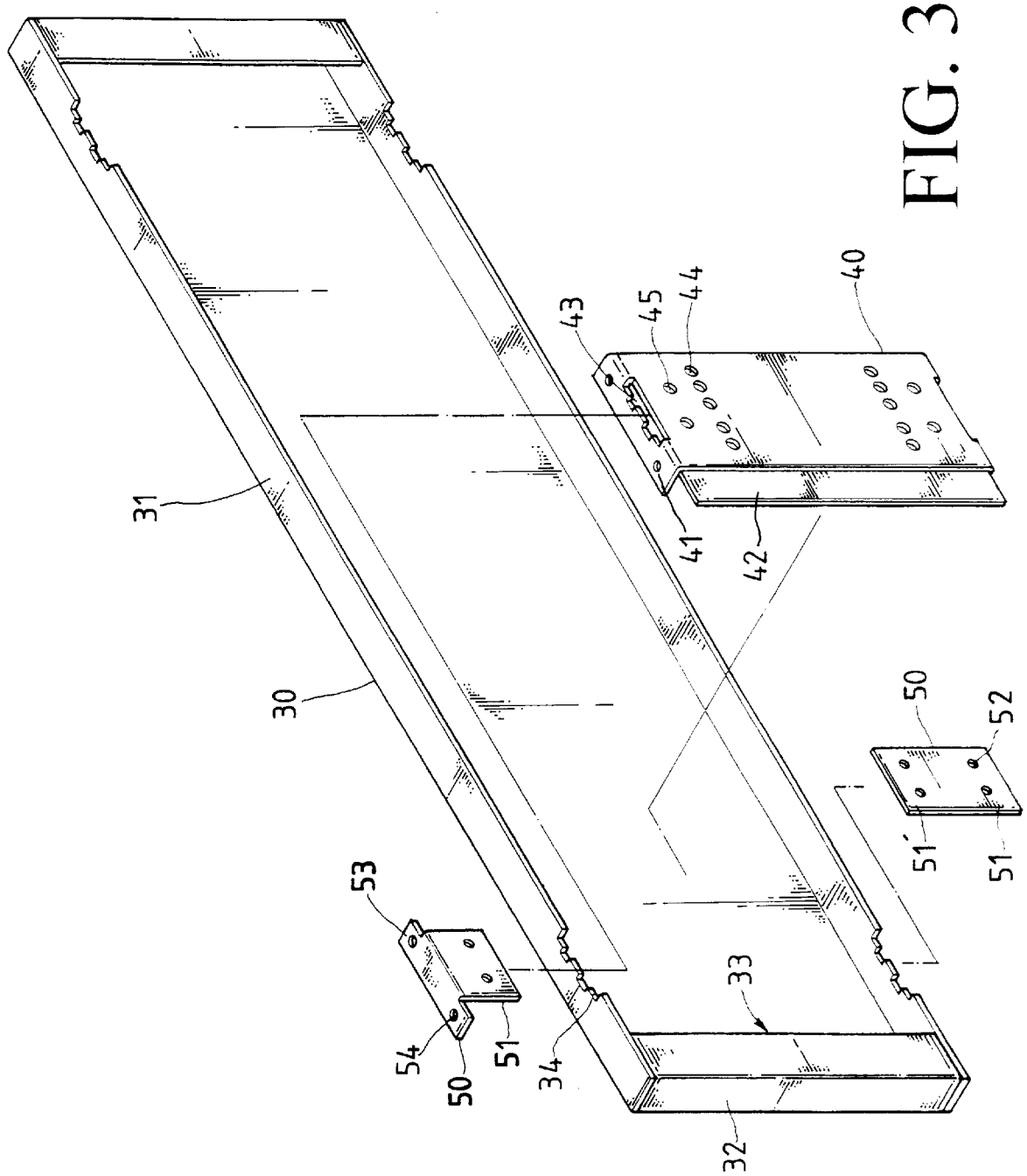
FIG. 3 is an exploded view of the assembly of a unit piece with the assembling pieces and connecting pieces.

Referring to FIGS. 1, 2, and 3, the preferred embodiment of the present invention comprises a cabinet 10 and a plurality of main frame racks 20. The cabinet comprises a frame body 11 with front and rear ends which are pivotally connected with door plates 12 and 13. Frame body 11 is assembled from side wall plates 19, top and bottom plates, and a sliding track 18 installed in a proper position on an inner portion of wall plates 19 for receiving a plurality of main frame racks 20. Racks 20 may have an U shape with a bead track groove 27 arranged on a respective position thereof so that it may be pulled out to receive a main frame and for repair thereof. Side wall plates 19 forming the body 11 are each formed by a plurality of modularized unit pieces 30, assembling pieces 40 and connecting pieces 50, which may be assembled by screws or the like.

Each unit piece 30 is a long rectangular plate and the four sides thereof are installed with rim portions 31 and 32. L-shaped rim portions 32 form stopping portions 33 on the front and rear sides of unit piece 30. Notches 24 are formed near the front and rear sides on the rim portions 31 of the top and bottom sides for assembling the assembling pieces 40 and connecting pieces 50.

Each assembling piece 40 is a medium plate having a top, a bottom and front/rear sides with rim portions 41. A flange 42 is formed on a rear/front side thereof to be inset in and engage the stopping portion 33. A slot 43 is formed in rim portions 41 of the top and bottom sides for insertion of connecting pieces 50. A plurality of assembling holes 44 and 45 are formed on each assembling piece 40 by which said sliding tracks 18 may be fixed and the connecting pieces 50 are locked.

Each connecting piece 50 is a small plate including at least one insertion portion 51. Connecting piece holes 52 are formed on the insertion portion 51 which is inserted in notches 34 and slots 43 to be connected to assembling pieces 40 as the interface for connecting unit pieces 30. The connecting pieces 50 between the middle unit pieces 30 and the upper and lower unit pieces 30 include insertion portions 51 at both ends, while the upper and lower unit pieces 30 have connecting pieces 50 for connecting the top and bottom plates which are T-shaped with a single insertion portion 51 and connecting holes 54 on a bent portion 53.

Figure 4:
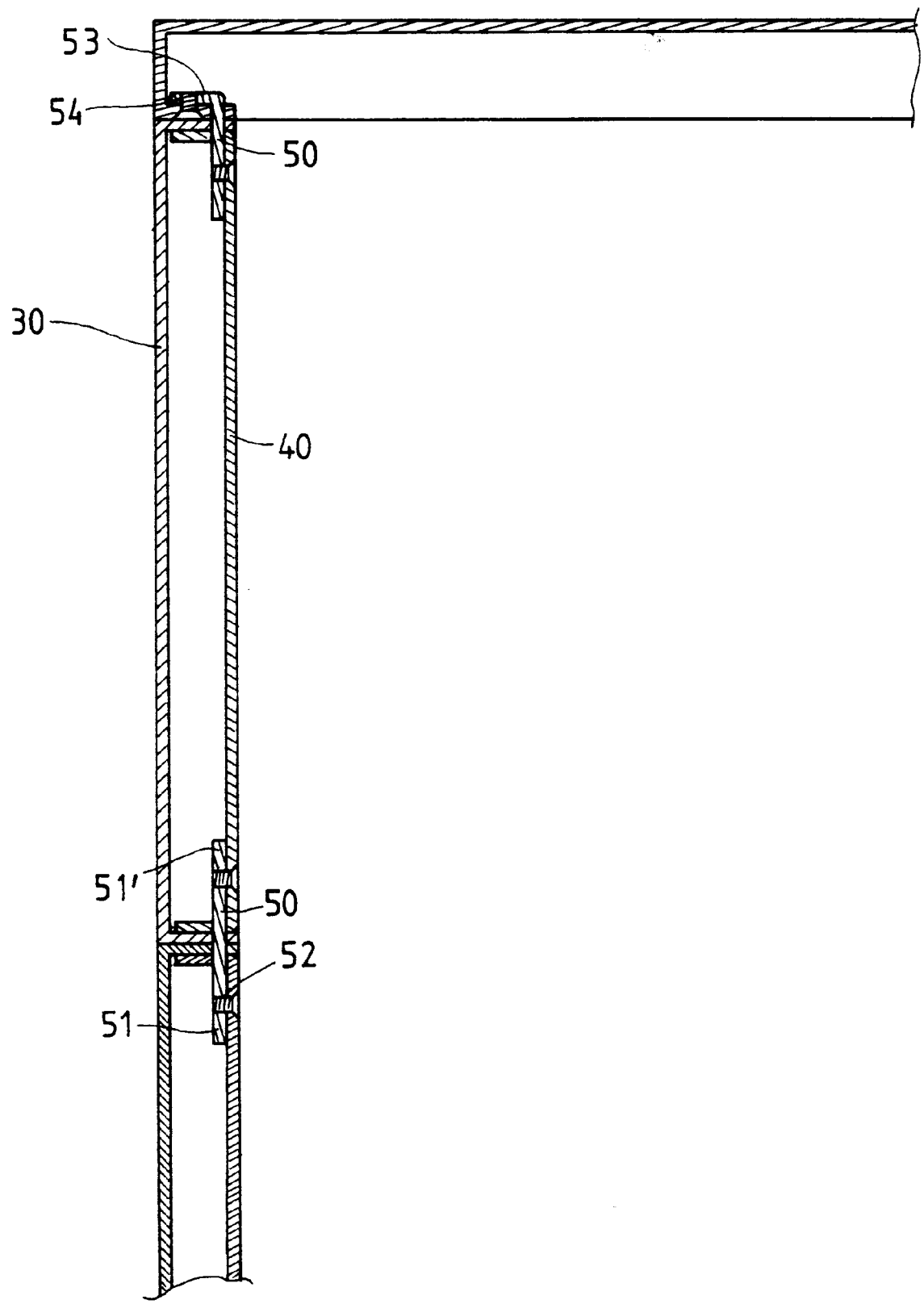
FIG. 4 is a cross sectional view showing the assembly according to FIG. 3 with a second unit piece and a top plate.

As shown in FIGS. 1, 3, and 4, the connecting pieces 50 may have an outer face which is crenelated corresponding to crenelation of outer sides of notches 34 and slots 43. In assembling, the assembling pieces 40 are placed into the front and rear sides of the unit pieces 30, then pushed transversely so that the flanges 42 are inset in the stopping portions 33 of unit pieces 30. Then, the insertion portions 51 of the connecting pieces 50 are inserted into the assembling pieces 40 through slots 43 via the notches 34 and fixed by a fixing screw or the like through connecting piece hole 52. Finally, the T-shaped connecting pieces 50 are assembled with the top and bottom plates on the upper and lower unit pieces 30, and the sliding track 18 is locked on all layers. Thereby, all kinds of modularized assembling structures may be coupled with different front and rear door plates 12 and 13 so to form cabinets with different specifications.

Figure 5:
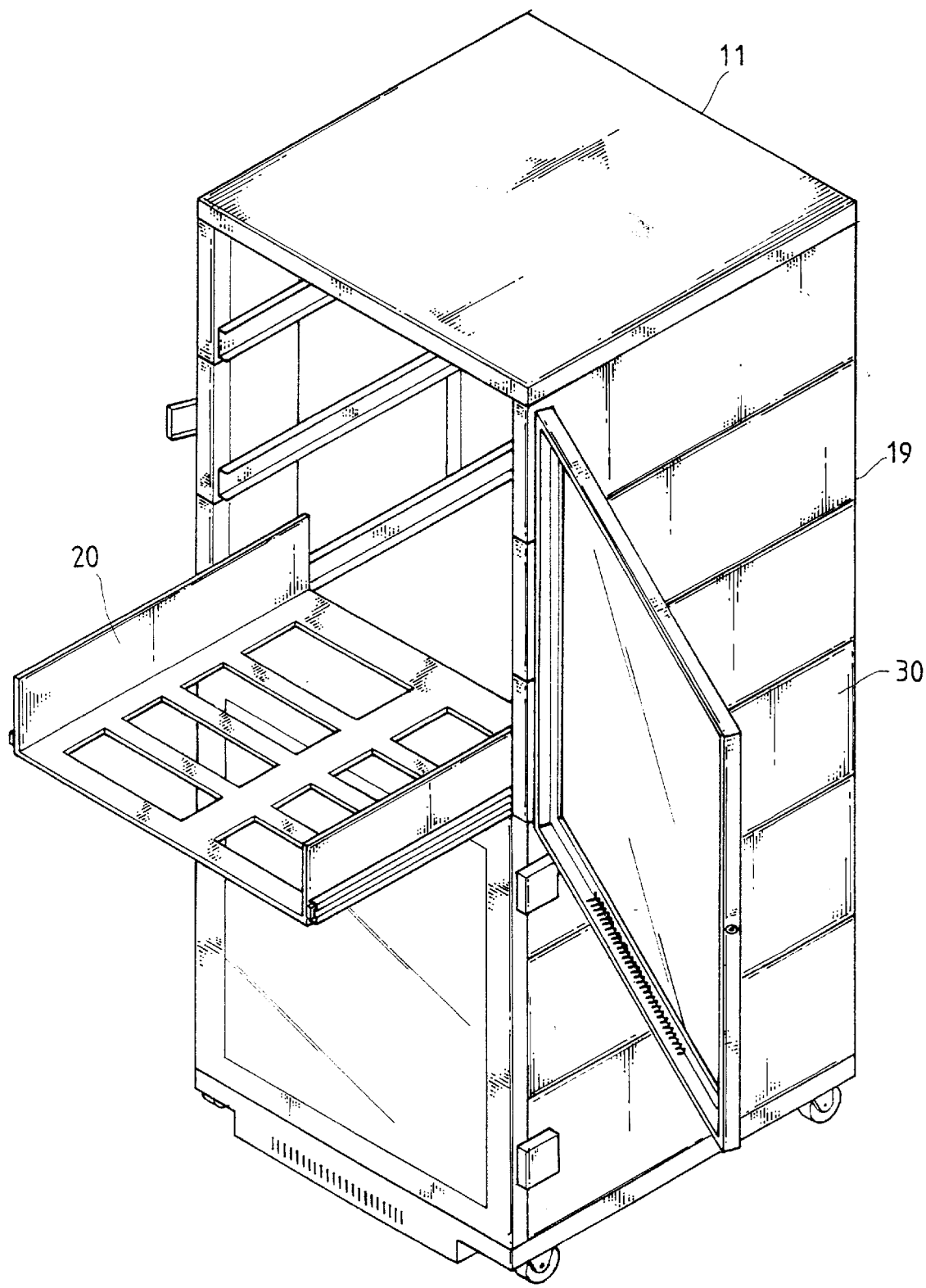
FIG. 5 is a perspective view showing expansion of the embodiment according to FIG. 1.

The two side wall plates 19 shown in FIGS. 1 and 5 are formed by three unit pieces and further coupled with front and rear door plates 12 and 13 with equal height so to form an independent working cabinet. If the capacity of the cabinet is not enough, the user need only buy a second modularized structure, detach the top plate and connect the second working cabinet on top. Thus, the height of the overall cabinet may be increased as desired. Therefore, the present invention has relative flexibility and enhances the usability of space.

Accordingly, in the aspect of the mobile modularized structure, the number of layers of the side wall plates of the working cabinet in the present invention may be further increased as desired. The specification may be varied according to the requirement of the market with the convenience of production and transportation being improved. Although a preferred embodiment of the present invention has been shown and described in detail, it should be understood that various changes and modification may be made therein without departing from the scope of the appended claims.

I claim:

1. A modularized computer servo working cabinet, comprising:
   at least two side wall plates assembled by a plurality of modularized unit pieces, each of said unit pieces being a large plate with notches and stopping portions formed thereon;
   a plurality of assembling pieces each being formed by a medium plate including a flange and a plurality of assembling piece holes, said assembling pieces being mounted to said side wall plates with each of said flanges engaged by one of said stopping portions;
   a plurality of connecting pieces each being formed by a small plate including at least one insertion portion with connecting piece holes, said insertion portions being inserted in said notches of said unit pieces to connect them via said connecting piece holes and said assembling piece holes;
   at least one sliding track mounted in a proper position on an inner portion of each of said side wall plates via said assembling piece holes; and
   at least one U-shaped main frame rack with bead track grooves mounted thereon, said bead track grooves being received in said sliding tracks on each of said side wall plates.

2. A modularized computer servo working cabinet according to claim 1, wherein each of said side wall plates is formed by connecting an upper, a middle and a lower of said unit pieces together;
   wherein each of said unit pieces has an elongated rectangular shape with front, rear, top and bottom sides, said front and rear sides each including an L-shaped rim portion forming one of said stopping portions, said top and bottom sides each including a rim portion having one of said notches formed thereon near said front side and said rear side, respectively; and
   wherein each of said assembling pieces has top, bottom and front/rear sides with rim portions thereon and a rear/front side with said flange thereon, said top and bottom side rim portions each having a slot formed thereon to correspond with said notches and receive said insertion portions of said connecting pieces, each of said flanges being inset in one of said stopping portions.

3. A modularized computer servo working cabinet according to claim 2, wherein an outer side of each of said notches, an outer side of each of said slots and an outer face of each of said connecting pieces are crenelated such that said faces of said connecting pieces engage said outer sides of said notches and slots.

4. A modularized computer servo working cabinet according to claim 3, wherein said connecting pieces inserted in said notches on said top side rim portion of each of said upper unit pieces and said notches on said bottom side rim portion of each of said lower unit pieces are T-shaped with a bent portion, said bent portion having connecting holes.

5. A modularized computer servo working cabinet according to claim 2, wherein said connecting pieces inserted in said notches on said top side rim portion of each of said upper unit pieces and said notches on said bottom side rim portion of each of said lower unit pieces are T-shaped with a bent portion, said bent portion having connecting holes.

\* \* \* \* \*